United States Patent [19]

Hallford

[11] 4,392,250
[45] Jul. 5, 1983

[54] SYMMETRIC MICROWAVE MIXER

[75] Inventor: Ben R. Hallford, Wylie, Tex.

[73] Assignee: Rockwell International Corporation, El Segundo, Calif.

[21] Appl. No.: 265,128

[22] Filed: May 19, 1981

[51] Int. Cl.³ ............................................. H04B 1/26
[52] U.S. Cl. ...................................... 455/327; 333/26
[58] Field of Search ............................... 455/325–327, 455/330, 331; 333/25, 26

[56] References Cited

U.S. PATENT DOCUMENTS

| | | |
|---|---|---|
| 2,834,876 | 5/1958 | Pritchard et al. |
| 3,652,941 | 3/1972 | Neuf. |
| 3,678,433 | 7/1972 | Hallford. |
| 3,681,697 | 8/1972 | Moroney. |
| 3,831,097 | 8/1974 | Neuf. |
| 4,186,352 | 1/1980 | Hallford ............................ 455/327 |
| 4,240,052 | 12/1980 | Hallford et al. |
| 4,293,956 | 10/1981 | Altstatt ............................. 455/327 |

OTHER PUBLICATIONS

Julius Lange, "Interdigitated Strip-Line Quadrature Hybrid", 1969 International Microwave Symposium, Dallas, Texas, May 5–7, IEEE Cat. No. 69 c 6, pp. 10–13.
Ben R. Hallford, "Trace Phase States to Check Mixer Designs", *Microwaves*, Jun. 1980, pp. 52–60.
L. E. Dickens and D. W. Maki, "A New 'Phase-Typed' Image Enhanced Mixer", 1975 *IEEE MTT Symposium*, pp. 149–151.
George L. Matthaei et al., "Microwave Filters, Impedance-Matching Networks, and Coupling Structures", New York, McGraw-Hill, 1964, pp. 809–812.

*Primary Examiner*—Marc E. Bookbinder
*Attorney, Agent, or Firm*—Michael E. Taken; Bruce C. Lutz; Howard R. Greenberg

[57] ABSTRACT

Microwave circuit layout structure is disclosed for a diode mixer bridge. The circuit layout structure is compact and symmetric, and enables short orthogonal equal length leads from a diode ring quad mixer bridge. The configuration also affords equal path lengths through the diodes to provide precise 180° phase differential image frequency cancellation. The structure also affords precise and consistent mounting of the mixer bridge, to further improve performance.

33 Claims, 6 Drawing Figures

SYMMETRIC MICROWAVE MIXER

TECHNICAL FIELD

The invention relates to microwave diode mixers and associated circuitry for up and down conversion between high frequency signals (e.g., RF or LO in the 6 GHz range) and low frequency signals (e.g., IF in the 70 MHz range), and more particularly to the circuit layout structure supplying the ports for a diode mixer bridge.

BACKGROUND AND SUMMARY

The present invention evolved from continuing development efforts pertaining to subject matter disclosed in my co-pending Application Ser. No. 216,872, filed Dec. 15, 1980, entitled "Balun Coupled Microwave Frequency Converter" now U.S. Pat. No. 4,330,868. This co-pending Application discloses a diode mixer bridge with a port, such as the RF input port, supplied by balanced coplanar conductors.

The present invention relates to improvements in the microstrip circuit layout and structure for ports to a mixer bridge. The invention enables symmetry among the microwave conductors leading to the bridge in a compact layout. This compact symmetry of the mixer port structure significantly reduces unwanted sensitivity to adverse parameters, and also overcomes previous problems of distortion caused by unequal conduction paths and diode lead lengths.

Transmission lengths along the microwave conductors leading to the mixer bridge are minimized, to reduce loss and exposure to mismatch influences. Transmission path lengths through the diodes of the mixer bridge are also minimized, and are substantially equal, to thus eliminate unwanted phase shift due to differential path lengths through the mixer diodes. The diode mixer leads are short and orthogonal, to provide good impedance matching and minimize unwanted coupling. The microwave conductors supplying the ports to the mixer are also orthogonal, to reduce unwanted coupling therebetween.

In another desirable aspect of the invention, the substrate circuit layout affords keyed alignment mounting of the diode bridge in a singular precise position and positively locks the bridge in place. This positive, singular registry of the diode bridge affords consistency of mounting location and orientation, which eliminates circuit unbalance and differing performance from one unit to another otherwise due to imprecise variable positioning of the bridge. Even the slightest offset or lateral displacement can cause different path lengths and thus unwanted phase shifts.

In a further desirable aspect of the invention, a single mixer of the diode-quad bridge type is provided and affords microwave frequency conversion without the undesirable characteristics of slot line transmission. Image frequency signals generated in the two diode pairs circulate in the diode quad only, to return the image frequency power to the diodes to reduce conversion loss. There is mutual isolation between RF, LO and IF signals over a broad frequency range. The circuit accepts transposed RF and LO inputs.

It has been found that the operating bandwidth of the mixer is significantly increased by the use of the balanced port structure of the invention, the equalized conduction path lengths, the short lead lengths, and single point connections between the diode pairs facilitating "zero lead length" between the diode connection points.

In another aspect of the invention, standard printed circuit board techniques may be used for fabrication, resulting in significant cost reduction. The invention also enables the use of low dielectric constant substrate material, further reducing cost.

DETAILED DESCRIPTION

Figure 1:
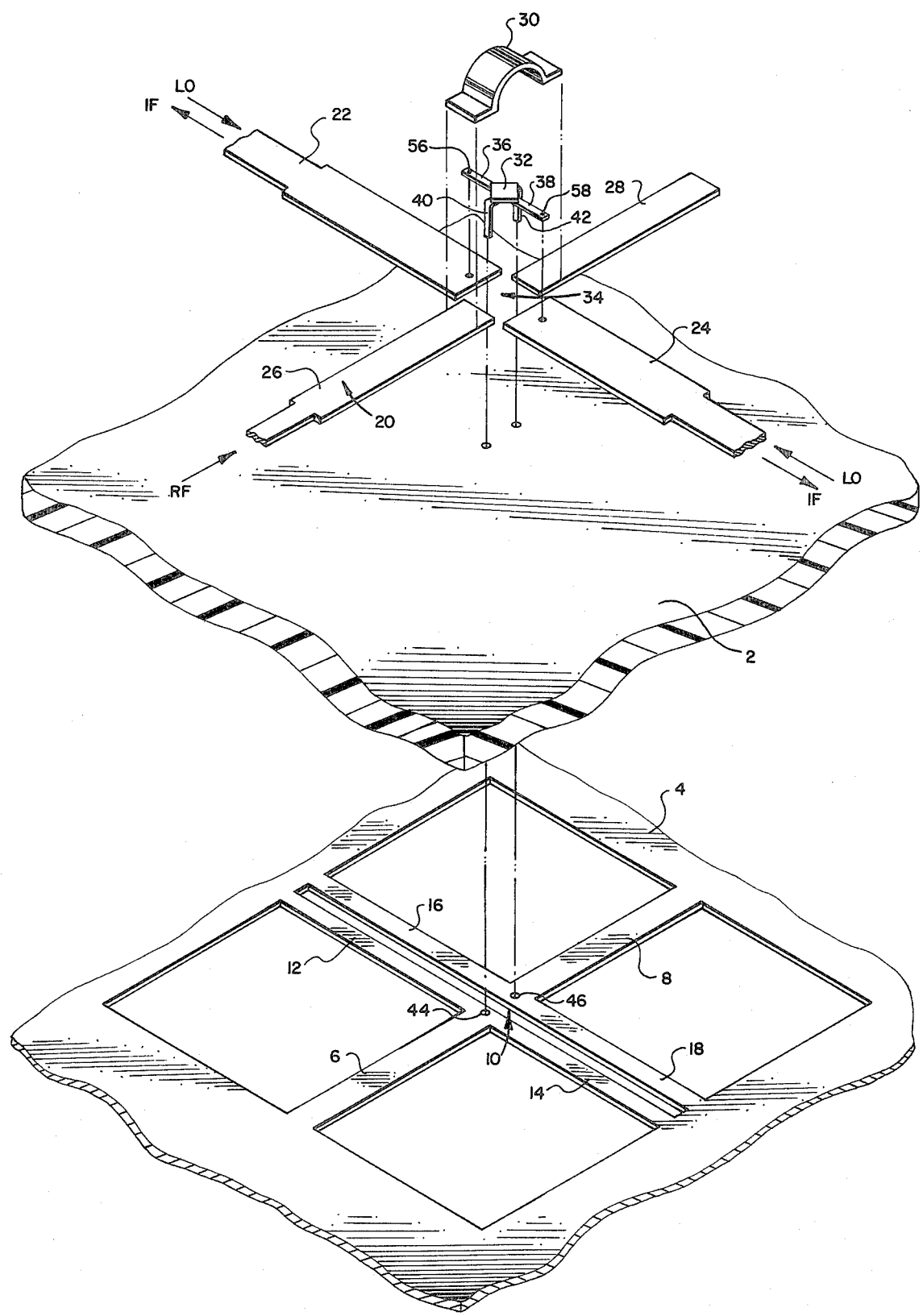
FIG. 1 is an exploded isometric view of microstrip circuit layout and structure constructed in accordance with the invention supplying the ports for a diode mixer bridge.
Figure 2:
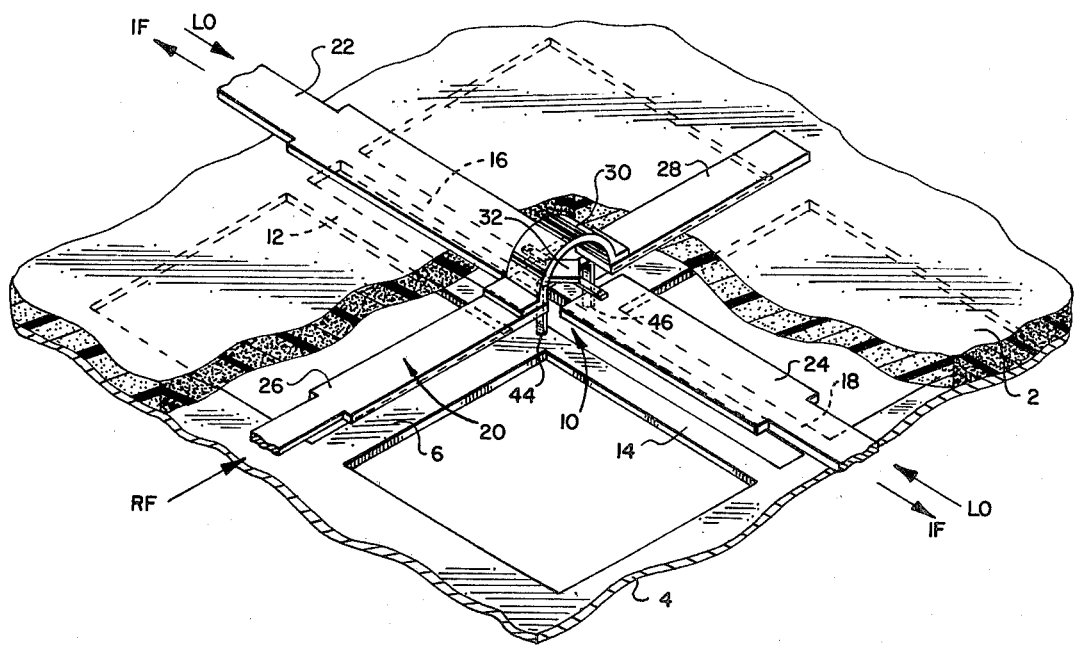
FIG. 2 is an assembly isometric view of the circuit layout and structure of FIG. 1.

FIGS. 1 and 2 show microstrip circuit layout structure constructed in accordance with the invention for a microwave mixer frequency converter. A planar dielectric substrate 2 has a ground plane 4 on the bottom side thereof. First and second conductors 6 and 8 extend from the ground plane towards each other to a separation gap 10 therebetween. Each conductor 6 and 8 has oppositely collinearly divergent stubs 12 and 14, and 16 and 18, respectively, extending to ground plane 4. An RF transmission line 20 is on the top side of substrate 2 juxtaposed the first and second conductors 6 and 8 for interacting therewith to balun couple a field balanced between conductors 6 and 8 across gap 10.

Figure 3:
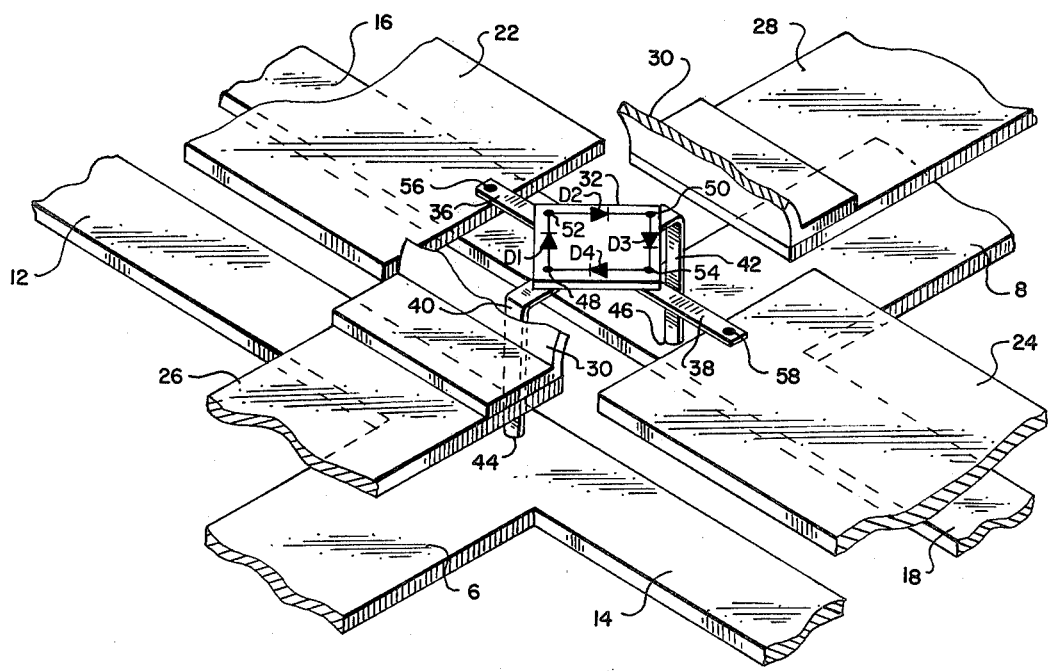
FIG. 3 is an enlarged view of the central portion of FIG. 2.

Also on the top side of substrate 2 are third and fourth collinear conductors 22 and 24 coplanar with and orthogonal to transmission line 20. Third and fourth conductors 22 and 24 extend towards each other and are juxtaposed respective pairs of stubs 12 and 16, and 14 and 18. In one embodiment of the invention, transmission line 20 has a first section 26 spaced above first conductor 6, and a second section 28 spaced above second conductor 8. A jumper section 30 connects the first and second sections 26 and 28. As shown in FIGS. 1-3, a diode mixer bridge 32 is disposed beneath jumper section 30 and interconnects conductors 6, 22, 8 and 24 for heterodyne modulation product signal generation, described hereinafter. Third and fourth conductors 22 and 24 carry LO signals and are separated by a gap 34, FIG. 1. Gap 34 also separates the first and second sections 26 and 28 of RF transmission line 20. Gap 34 is above gap 10 and below jumper section 30.

The first stubs 12 and 16 of each pair extend in spaced parallel relation from the facing ends (ends nearest each other) of first and second conductors 6 and 8 to the ground plane 4. Likewise, the second stubs 14 and 18 of each pair extend in spaced parallel relation from the facing ends of conductors 6 and 8 to ground plane 4. First and second conductors 6 and 8 are collinear, and are orthogonal to the stubs. The third and fourth conductors 22 and 24 are collinear, and are orthogonal to transmission line 20.

FIG. 3 shows the connection of diode mixer bridge 32. This mixer has a diode quad ring, and the diodes are schematically illustrated. The mixer bridge has four leads interconnecting balanced RF induced conductors 6 and 8 and LO conductors 22 and 24. Mixer bridge 32 is on top of substrate 2 and has leads 36 and 38 ohmically connected to conductors 22 and 24, respectively. The remaining two leads 40 and 42 from the mixer bridge extend down through substrate 2 and are ohmically connected to conductors 6 and 8 by insertion through apertures 44 and 46 therein, respectively. This mounting arrangement locks mixer bridge 32 singularly in place with little or no free play, which could otherwise cause unwanted distortion, phase shift and the like. Leads 36, 42, 38 and 40 are orthogonal, short and have substantially the same length to their respective conductor connections. This provides equal path lengths through the diodes, which enhances mixer performance.

When implemented as a down converter, an RF signal is input at port 20, FIG. 2, and two quadrature LO signals are input at ports 22 and 24. The RF signal is coupled from transmission line 20 and sections 26 and 28, acting as a primary, to secondary conductors 6 and 8, which in turn provide the field existing across gap 10 between balanced first and second conductors 6 and 8, FIG. 1. Conductors 6 and 8 thus provide a balanced input port to diode mixer bridge 32 at points 48 and 50, FIG. 3. The LO signals from the input ports provided by third and fourth conductors 22 and 24 are provided to the bridge at points 52 and 54.

Diode mixer bridge 32 receives the RF and LO signals and outputs a plurality of frequencies, including an IF signal at a frequency which is the difference between the RF and LO signal frequencies. The frequencies which are output from mixer 32 are the modulation products which exist according to the heterodyne principle by which the mixer operates, as known in the art, wherein an RF signal and an LO signal are applied to a non-linear element, such as a diode. The RF and LO signals are mixed in the diode quad 32 to generate the various modulated frequencies, including IF signals on conductors 22 and 24. These IF signals may be passed through IF bandpass filters, for example as described in my U.S. Pat. No. 3,678,433, issued July 18, 1972, entitled "RF Rejection Filter". The outputs of such filters may, for example, be connected to a 90° quadrature hybrid 3 dB coupler, for example as shown in U.S. Pat. No. 3,831,097 to Neuf. The LO signals supplied to conductors 22 and 24 may be passed through IF rejection capacitors or filters, i.e., LO bandpass filters, such as shown in my U.S. Pat. No. 4,240,052, issued Dec. 16, 1980 entitled "Balun Filter Apparatus". These signals may also be passed through a branchline coupler, such as described in "Microwave Filters, Impedance-Matching Networks, and Coupling Structures", George L. Matthaei, et al., McGraw-Hill, New York, 1964, pp. 809-812, or through an interdigitated strip Lange-type coupler, for example as described in "Interdigitated Strip-Line Quadrature Hybrid", Julius Lange, 1969 International Microwave Symposium, Dallas, Texas, May 5-7, IEEE Cat. No. 69 c 6, pp, 10-13.

When implemented as an up converter, LO and IF signals are each input at ports 22 and 24 to generate an output RF signal at port 20. In this latter implementation, the RF signal is induced on transmission line 20 at its first and second sections 26 and 28 from first and second conductors 6 and 8 acting as primaries. In other applications, for both up and down converters, the RF and LO signals are transposed.

As is known in the art, a down converter mixer generates a signal which is the image of the RF signal but on the opposite frequency side of the LO signal. For instance, a mixer receiving a 6 GHz (6,000 MHz) input RF signal and a 5,930 MHz input LO signal would generate a 70 MHz IF signal and a 5,860 MHz image RF signal. Typically about half of the incoming RF power is used in generating this image frequency signal. The loss in converting an incoming RF signal to an IF signal is thus significantly increased by this image frequency generation. Likewise for up conversion, conversion loss is caused by frequency generation of an unused sideband. For further background regarding mixer operation, reference is made to my article entitled "Trace Phase States to Check Mixer Designs", Microwaves, June, 1980, pp. 52-60.

Prior art devices have eliminated the image frequency signal in a variety of ways. Some devices use filters to prevent the image frequency signal from entering the input signal circuitry, but this still results in an energy loss to the system, and also reduced bandwidth. Some devices provide an open or short circuit at the diodes in order to recover, or reduce the loss of, the image frequency energy. U.S. Pat. Nos. 2,834,876 and 3,681,697 show image recovery mixers where the image frequency power is reflected back to the mixer to provide recovery of the image frequency energy. Another technique is the use of a diode quad bridge, for example U.S. Pat. Nos. 3,831,097 and 3,652,941 to Neuf, for cancelling the image frequency within the mixer by circulating the image current in the diode quad only. This returns the image frequency power to the diodes, thus reducing conversion loss.

Reduction of conversion loss in the mixer bridge is degraded by various influences introducing distortion and unwanted phase shift, causing other than a precise 180° phase differential between the two diode pairs for the generated image frequency. Some of these degrading influences include long lead lengths from the mixer bridge (inducing stray capacitance), unequal lead lengths, and undesired coupling between the leads caused by non-orthogonal orientation therebetween. The present invention offers significant improvements substantially overcoming these degrading influences.

Referring to FIG. 3, the lengths of mixer bridge leads 36, 42, 38 and 40 are extremely short, and have substantially the same length. These leads are also oriented orthogonally with respect to each other as they extend outwardly from mixer bridge 32. This symmetric structure affords substantially equal path lengths through the diodes. For example, the path length from connection point 44 through diode D1 to connection point 56 is substantially equal to the path length from connection point 54 through diode D2 to connection point 46, which in turn is substantially equal to the path length from connection point 46 through D3 to connection point 58, which in turn is substantially equal to the path length from connection point 58 through diode D4 to connection point 44.

The symmetric structure of the invention and the substantially equal path lengths through the diodes provide a precise 180° phase differential between the diode pairs for generated image frequency, and a net image voltage of zero, thus reducing conversion loss. Unequal path lengths would cause a finite traversal distance for the image current on one or more of the conductors and this would cause a phase shift such that the image frequency phase in diode pair D1 and D2, for example, would be other than 180° out of phase with the image frequency phase in diode pair D3 and D4. This would reduce the conversion efficiency because of uncancelled image frequency power.

The structure of FIG. 3 also enables single connection points on each of the conductors for the diode mixer bridge. RF conductor aperture 44 provides a single common connection point for diodes D4 and D1. LO conductor point 56 provides a single common connection point for diodes D1 and D2. RF conductor aperture 46 provides a single common connection point for diodes D2 and D3. LO conductor point 58 provides a single common connection point for diodes D3 and D4. These common connection points for the respective diodes further provide precise 180° phase differential between the diode pairs for generated image frequency, and a net image voltage of zero, thus reducing conversion loss. In the absence of these single point connections between the diode pairs, there would be a finite traversal distance for the image current on one or more of the conductors and this would cause a phase shift such that the image frequency phase in one diode pair would be other than 180° out of phase with the image frequency phase in the other diode pair.

In a desirable aspect of the invention, the circuit layout structure is fabricated using standard circuit board techniques. A simple off-the-shelf dielectric substrate which is copper clad on both sides is used. The copper is merely etched away to yield the conductor patterns shown.

In another particularly advantageous aspect of the invention, the circuit layout and structure enables microstrip transmission on the substrate as opposed to slotline transmission and its attendant constraints. For example, a mixer circuit with a diode quad mixer bridge is shown in a paper entitled "A New 'Phase-Typed' Image Enhanced Mixer", L. E. Dickens and D. W. Maki, 1975 IEEE M.T.T. Symposium, pp. 149–151, and in U.S. Pat. 3,772,599 to Ernst et al. The mixer is formed by two pairs of diodes providing a bridge across a slot transmission line. While these mixers are useful for their intended purpose, they suffer the inherent disadvantages and undesirable characteristics of slotline circuits, including the various constraints on the dimensions of the slot, minimum ground plane spacing on either side of the slot, the requisite high dielectric constant substrate, transmission mode waveguide problems, etc. The width of the slot should usually be no greater than 5 to 10 mils. A dielectric substrate having a high magnitude of relative dielectric constant of 9 to 10 or greater is needed. If the slotline is to be generally useful as a transmission line, the fields must be closely confined to the slot. Close confinement can be achieved with slots of realistic dimensions by using a fairly high dielectric constant substrate. If the guide wave length is roughly 30 to 40 percent of the free space wave length, the fields will be adequately confined. Low dielectric constant substrates, for example less than about 8, are typically not suitable for slotline application because the energy is not well confined to the slot.

The present invention is implementable on low dielectric constant substrate, for example in the range 2 to 5. While a high dielectric constant substrate may of course be used, the use of a low dielectric constant substrate is preferred in order to reduce cost.

The preferred dimensions of the conductor widths and gap widths are easily and cost efficiently implementable with standard printed circuit board techniques. For a typical 6 GHz mixer, the width of gap 10 is 36 mils, and the width of each of stubs 12, 16, 14 and 18 is also 36 mils. The width of first and second conductors 6 and 8 is 60 mils. The combined length of stubs 12 and 14 is 685 mils, and the combined length of first and second conductors 6 and 8 plus the width of gap 10 is also 685 mils. The diameter of apertures 44 and 46 is 20 mils. The width of transmission line sections 26 and 28 is 60 mils. The width of the wide portions of the third and fourth conductors 22 and 24 is 108 mils. The width of gap 34 between transmission line sections 26 and 28 is 100 mils, and the width of gap 34 between third and fourth conductors 22 and 24 is 80 mils. The substrate has a dielectric constant of 2.17 and a thickness of 15 mils.

Though not a constraint of the invention, the above noted parameters are significant, particularly the gap width and dielectric constant. In some applications employing a balun port to a mixer bridge, as supplied by conductors 6 and 8, it is desired to employ transmission line conductors having a width not less than about 40 mils and a gap between conductors not less than about 6 mils. Many of these arrangements, however, were found to have an impedance over 100 ohms, which was undesirable because it did not match existing 50 ohm transmission lines. To reduce the impedance of the balanced port to the diode mixer bridge to about 50 ohms, it was necessary to reduce the width of the gap between the balanced conductors to about 3 mils. This in turn was not desirable because a 3 mil gap was deemed too narrow to etch within prescribed manufacturing cost considerations.

The present invention affords relatively large dimensions which are easy to implement and cost efficient in manufacture. The invention further eliminates the need for a pair of balanced conductor extension sections between respective conductors 6 and 8 and the location of the mixer bridge, wherein the extension sections have the transmission line induced field therebetween and supply a balanced port to the mixer. The invention also enables the use of low dielectric constant substrate material, further reducing cost.

The circuit layout provides mutual isolation between the RF, LO and IF signals. Referring to FIG. 3, the LO signal on conductor 24 is isolated from conductor 22 because of the effective ground provided by points 44 and 46. One LO signal path from point 58 of conductor 24 to point 56 of conductor 22 is through diodes D4 and D1. However, the junction point between diodes D4 and D1 is the effective ground point 44 relative to LO signals, and hence the LO signal may flow from conductor point 58 through diode D4 but is isolated from conductor point 56. Point 44 appears to be an effective ground relative to LO signals because of its pair of stubs 12 and 14. The other LO signal path from conductor point 58 to conductor point 56 is through diodes D3 and D2, but the junction point 50 therebetween is the effective ground point 46 due to stubs 16 and 18. LO signals from point 56 are likewise isolated from point 58. For applications requiring even greater isolation, the ring quad 32 of FIG. 3 may be replaced by a bridge quad wherein the polarities of diodes D3 and D4 are reversed.

The RF signal on balanced junction points 48 and 50 due to the induced RF field between conductor 6 and 8 across gap 10 is isolated from conductors 22 and 24. The RF signal from junction point 48 flows through diode D1 and then diode D2 to junction point 50. Since RF conductor points 48 and 50 are balanced, they are each other's reference points, and hence the voltage on junction point 48 is referenced to junction point 50, not to ground. The RF signal from junction point 48 flows through diode D1 toward point 52 and then away from point 52 through diode D2. Conductor point 52 thus sees opposite polarities (voltages which are 180° out of phase), and hence no new or additional net voltage is induced on conductor point 52 from the RF signal between conductor points 48 and 50. The RF signal between junction points 48 and 50 is likewise isolated from conductor 24 and point 54.

The LO signals on conductors 22 and 24 are isolated from the RF signal between points 48 and 50. The LO signal on point 52 sees an effective ground at each of points 48 and 50, due to the grounding stubs whereby to add the same effective voltage to each in parallel, resulting in no change of the net voltage difference between points 48 and 50. The LO signal on conductor 22 sees equal reference levels at points 48 and 50 due to stubs 12 and 16 along which conductor 22 extends in closely spaced parallel relation. The LO signal on point 54 is likewise isolated from the RF signal between points 48 and 50.

Figure 4:
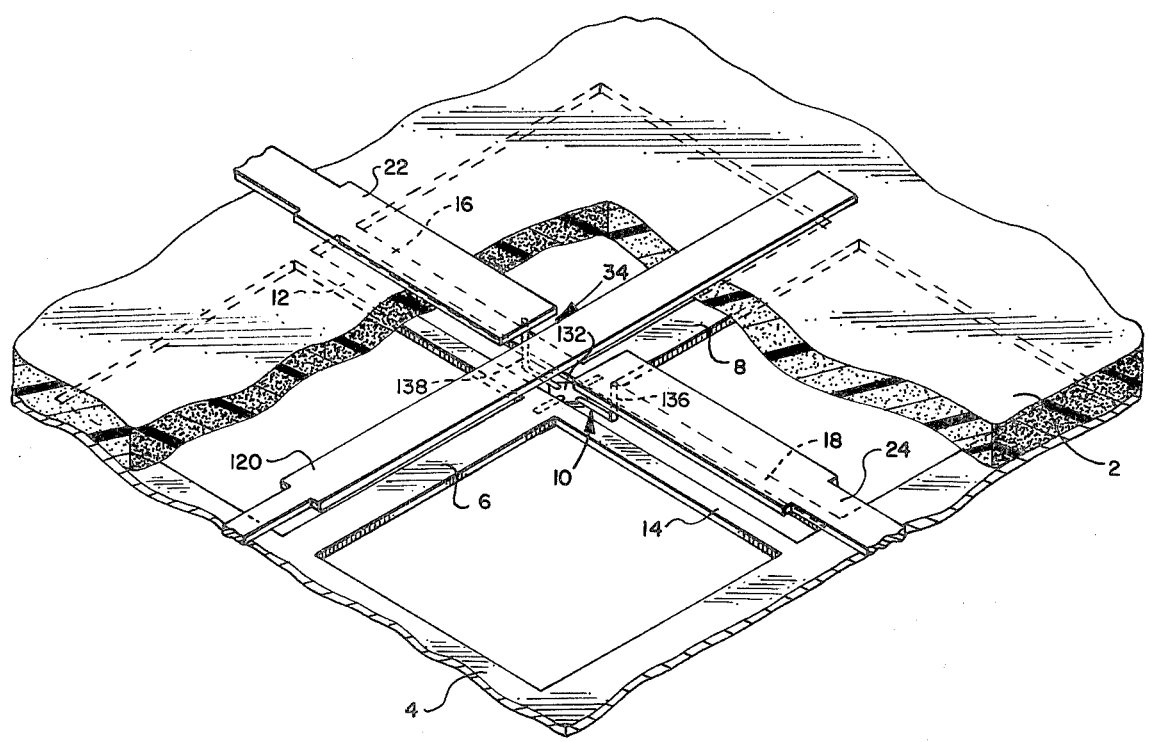
FIG. 4 is an assembly isometric view like FIG. 2 and shows an alternate embodiment.
Figure 5:
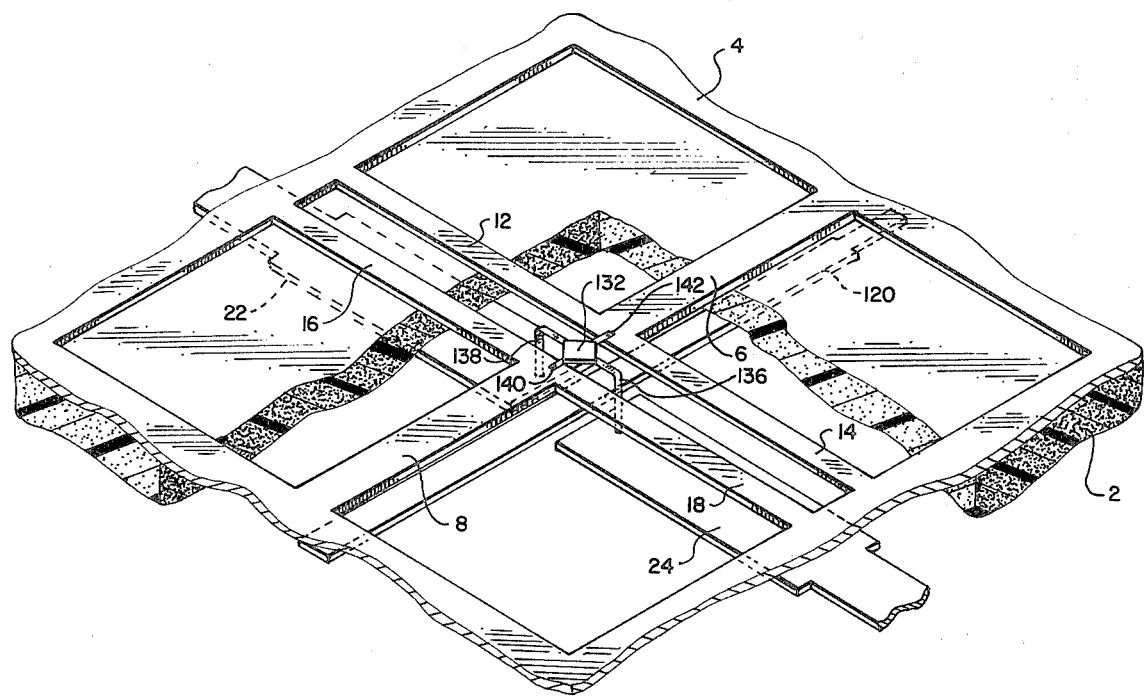
FIG. 5 shows the structure of FIG. 4 flipped over (rotated 180°) about the axis formed by conductors 22 and 24, to provide a better view of the conductor pattern on the bottom of the substrate.
Figure 6:
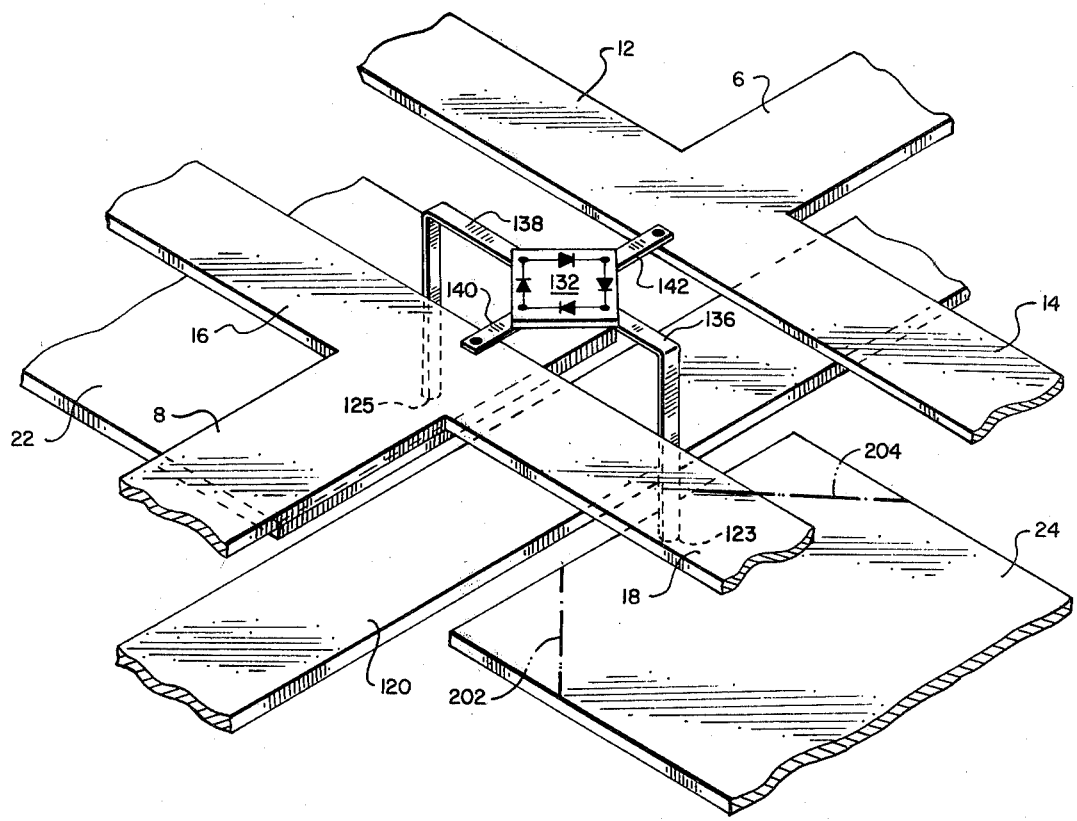
FIG. 6 is an enlarged view of the central portion of FIG. 5.

FIG. 4 shows an alternative structure to that shown in FIG. 2, and like reference characters are used where appropriate to facilitate understanding. A one-piece RF transmission line 120 is provided and extends through the gap 34 which separates the third and fourth conductors 22 and 24. FIG. 5 shows the structure of FIG. 4 flipped over (rotated 180°) about the axis formed by conductors 22 and 24. FIG. 6 is an enlarged view of the central portion of FIG. 5 and better shows the interconnection of a diode mixer bridge 132 for FIG. 5. This bridge is connected on the bottom of substrate 2 of FIG. 4.

As with mixer bridge 32, FIG. 3, the mixer bridge 132 has orthogonal leads. Leads 140 and 142 are ohmically connected to first and second conductors 6 and 8, respectively, on the bottom of the substrate. Leads 140 and 142 correspond to leads 40 and 42 of FIG. 3 in that they are connected to the first and second conductors 6 and 8: however, leads 140 and 142 do not extend through the substrate. Leads 136 and 138 extend upwardly through the substrate to ohmically connect to conductors 22 and 24 through apertures 123 and 125 formed in third and fourth conductors 22 and 24 on top of the substrate. Leads 136 and 138 correspond to leads 36 and 38 of FIG. 3 except that leads 136 and 138 extend through the substrate.

As seen in FIG. 6, the port structure for the mixer is compact and symmetric as in FIG. 3. Also as in FIG. 3, the diode leads in FIG. 6 are short and orthogonal and have substantially the same length. The path lengths through the diodes are substantially equal, and this provides precise 180° phase differential and image frequency cancellation, reducing conversion loss. Also as in FIG. 3, the mounting of the mixer bridge in FIG. 6 is precise and regisered, to afford consistency of mounting location and orientation, to further reduce distortion, phase shift and the like.

As seen in FIGS. 2 and 4, the RF transmission line and the LO conductors are orthogonal. This reduces unwanted field coupling therebetween.

For improved isolation between conductors 22, 28, 24 and 26, FIG. 1, the proximate square edges of each may be tapered to provide greater separation therebetween. For example, in FIG. 6, the square edges of conductor 24 may be deleted as shown by diagonal edges 202 and 204 in dashed line. These diagonal edges are at 45° angles and taper conductor 24 down to about one-third of its original width facing conductor 120. This same tapered configuration may be implemented for conductors 22, 28 and 26 of FIG. 1.

It is recognized that various modifications are possible within the scope of the appended claims.

I claim:

1. Balun coupled microwave mixer circuit layout and structure comprising:
   a dielectric substrate having first and second surfaces;
   ground plane means on a first surface of said substrate;
   first and second conductors on said first surface of said substrate extending from said ground plane means towards each other to a separation gap therebetween;
   a transmission line on said second surface of said substrate for interacting with said first and second conductors to balun couple a field balanced between said first and second conductors across said gap;
   third and fourth conductors on said second surface of said substrate having spaced adjacent ends proximate the separation gap of said first and second conductors and extending oppositely away therefrom and
   a diode mixer interconnecting said conductors for heterodyne modulation product signal generation.

2. The invention according to claim 1 wherein said third and fourth conductors extend orthogonally to said first and second conductors to minimize unwanted coupling therebetween.

3. The invention according to claim 2 wherein said diode mixer has substantially equal lead lengths to each of said conductors to provide substantially equal path lengths through the diodes to substantially eliminate unwanted phase shift otherwise caused by differential path lengths through the diodes.

4. The invention according to claim 3 wherein said diode mixer leads are orthogonal with respect to each other.

5. The invention according to claim 3 wherein said diode mixer is connected by said leads to respective said conductors at a single point on each to further prevent unwanted phase shift otherwise caused by a finite traversal distance for image current on one or more of the conductors.

6. The invention according to claim 2 wherein said third and fourth conductors are collinear and coplanar.

7. The invention according to claim 6 wherein said transmission line is juxtaposed and parallel to said first and second conductors, and orthogonal to and coplanar with said third and fourth conductors.

8. The invention according to claim 7 wherein:
   said transmission line has a first section juxtaposed said first conductor and a second section juxtaposed said second conductor, and includes a jumper section connecting said first and second sections; and
   said diode mixer is disposed beneath said jumper section.

9. The invention according to claim 8 wherein said gap separating said third and fourth conductors also separates said first and second sections of said transmission line.

10. The invention according to claim 7 wherein said transmission line extends through said gap separating said third and fourth conductors.

11. Balun coupled microwave mixer circuit layout and structure comprising:
   a dielectric substrate;
   gound plane means on said substrate;
   first and second conductors on one side of said substrate extending from said ground plane means towards each other to a separation gap therebetween;
   a transmission line on the other side of said substrate juxtaposed and parallel to said first and second conductors for interacting therewith to balun couple a field balanced between said first and second conductors across said gap;
   third and fourth conductors on said other side of said substrate collinearly extending towards each other and separated by a gap juxtaposed said first mentioned gap, said third and fourth conductors extending orthogonally to said transmission line and said first and second conductors; and
   a diode mixer interconnecting said conductors for heterodyne modulation product signal generation, said diode mixer mounted by a first pair of opposite leads connected coplanarly to a given pair of said conductors and by a second pair of opposite leads extending through said substrate and connected to the other pair of said conductors, whereby to provide precise and registered mounting of the diode mixer, affording consistency of mounting location and orientation to minimize distortion and phase shift.

12. The invention according to claim 11 wherein said diode mixer has orthogonal substantially equal length leads.

13. The invention according to claim 11 wherein:
   said transmission line has a first section juxtaposed said first conductor and a second section juxtaposed said second conductor, and includes a jumper section connecting said first and second sections;
   said gap separating said third and fourth conductors also separates said first and second sections of said transmission line; and
   said diode mixer is mounted on said other side of said substrate beneath said jumper section and has a first pair of opposite leads coplanarly connected to respective said third and fourth conductors, and a second pair of opposite leads extending through said substrate to said one side thereof and connected to respective said first and second conductors.

14. The invention according to claim 11 wherein said transmission line extends through said gap separating said third and fourth conductors; and
   said diode mixer is mounted on said one side of said substrate and has a first pair of opposite leads coplanarly connected to said first and second conductors, and a second pair of opposite leads extending through said substrate to said other side thereof and connected to respective said third and fourth conductors.

15. Balun coupled microwave mixer circuit layout and structure comprising:
   a dielectric substrate having first and second surfaces;
   ground plane means on a first surface of said substrate;
   first and second conductors on said first surface of said substrate extending from said ground plane means towards each other to a separation gap therebetween;
   a transmission line on said second surface of said substrate for interacting with said first and second conductors to balun couple a field balanced between said first and second conductors across said gap;
   third and fourth conductors on said second surface of said substrate having spaced ends proximate the ends of said first and second conductors nearest each other and extending oppositely away therefrom; and
   a diode mixer interconnecting said conductors for heterodyne modulation product signal generation and isolating signals on said first and second conductors from signals on said third and fourth conductors.

16. The invention according to claim 15 wherein said diode mixer is connected between connection points on said conductors, and further comprising means setting the connection points on said first and second conductors at substantially the same potential reference level relative to signals on said third and fourth conductors such that no net potential is induced between said first and second conductors from either of said third and fourth conductors such that signals on said third and fourth conductors are isolated from said first and second conductors.

17. The invention according to claim 16 further including at each said first and second conductor connection points a high impedance relative to signals on said third and fourth conductors such that signals on said third conductor are isolated from said fourth conductor, and signals on said fourth conductor are isolated from signals on said third conductor.

18. The invention according to claim 16 including stub means extending from said first and second conductors to said ground plane.

19. The invention according to claim 18 wherein each of said first and second conductors has a pair of stubs diverging therefrom to said ground plane means.

20. The invention according to claim 19 wherein said third conductor is juxtaposed the first stub of each said pair, and said fourth conductor is juxtaposed the second stub of each said pair.

21. The invention according to claim 20 wherein:
   said first stubs extend in spaced parallel relation from the facing ends of said first and second conductors to said ground plane means; and
   said second stubs extend collinearly oppositely from said first stubs and in spaced parallel relation from the ends of said first and second conductors nearest each other to said ground plane means.

22. Balun coupled microwave mixer circuit layout and structure comprising:
   a dielectric substrate of low relative dielectric constant substantially less than 9 having first and second surfaces;
   ground plane means on a first surface of said substrate;
   first and second conductors on a first surface of said substrate extending from said ground plane means towards each other to a separation gap therebetween;

a transmission line on said second surface of said substrate for interacting with said first and second conductors to balun couple a field balanced between said first and second conductors across said gap;

third and fourth conductors on said second surface of said substrate having spaced ends proximate the separation gap between ends of said first and second conductors and extending oppositely away therefrom; and a diode mixer interconnecting said conductors for heterodyne modulation product signal generation.

23. The invention according to claim 22 wherein the width of said separation gap is substantially greater than 6 mils.

24. The invention according to claim 22 wherein said circuit layout and structure is fabricated on a printed circuit board comprising a metal clad dielectric substrate etched to provide a microstrip pattern forming said ground plane means, said first, second, third and fourth conductors, and said transmission line.

25. Balun coupled microwave mixer circuit layout and structure comprising:

a ground plane;

first and second conductors extending from said ground plane towards each other to a separation gap therebetween, each conductor having oppositely collinearly diverging stubs extending to said ground plane;

a transmission line juxtaposed said first and second conductors for interacting therewith to balun couple a field balanced between said first and second conductors across said gap;

third and fourth collinear conductors coplanar with and orthogonal to said transmission line and extending towards each other juxtaposed respective pairs of said stubs; and a diode mixer interconnecting said conductors for heterodyne modulation product signal generation.

26. The invention according to claim 25 wherein:

said transmission line has a first section spaced above said first conductor and a second section spaced above said second conductor, and includes a jumper section connecting said first and second sections; and said diode mixer is disposed beneath said jumper section.

27. The invention according to claim 26 wherein said third and fourth conductors are separated by a gap, which gap also separates said first and second sections of said transmission line, and which gap is above said first mentioned gap and below said jumper section.

28. The invention according to claim 25 wherein said third and fourth conductors are separated by a gap through which said transmission line extends.

29. The invention according to claim 25 wherein said diode mixer comprises a ring quad with orthogonal leads.

30. Balun coupled microwave mixer circuit layout and structure comprising:

a dielectric planar substrate;

ground plane means on said substrate;

first and second conductors on one side of said substrate extending from said ground plane means towards each other to a separation gap therebetween, each conductor having a pair of stubs diverging therefrom to said ground plane means;

a transmission line on the other side of said substrate and juxtaposed said first and second conductors for interacting therewith to balun couple a field balanced between said first and second conductors across said gap;

third and fourth conductors on said other side of said substrate extending towards each other to a separation gap therebetween juxtaposed said first mentioned gap, said third conductor being juxtaposed the first stub of each said pair, and said fourth conductor being juxtaposed the second stub of each said pair; and a diode mixer interconnecting said conductors for heterodyne modulation product signal generation.

31. The invention according to claim 30 wherein:

said first stubs extend in spaced parallel relation from the ends of said first and second conductors nearest each other to said ground plane means; and said second stubs extend collinearly oppositely from said first stubs and in spaced parallel relation from the ends of said first and second conductors nearest each other to said ground plane means.

32. The invention according to claim 31 wherein:

said first and second conductors are collinear, and are orthogonal to said stubs; and said third and fourth conductors are collinear, and are orthogonal to said transmission line.

33. The invention according to claim 32 wherein said diode mixer is connected to the nearest ends of said first and second conductors and the nearest ends of said third and fourth conductors at a single point on each.

* * * * *